United States Patent
Ankney et al.

(10) Patent No.: US 10,197,084 B1
(45) Date of Patent: Feb. 5, 2019

(54) AVIONICS CAM RETAINER ASSEMBLY

(71) Applicant: Hamilton Sundstrand Corporation, Charlotte, NC (US)

(72) Inventors: Darrell E. Ankney, Dixon, IL (US); Andrei Arevalo, Rockford, IL (US); Paul Gilmore, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/822,550

(22) Filed: Nov. 27, 2017

(51) Int. Cl.
| | |
|---|---|
| *F16B 21/09* | (2006.01) |
| *G06F 1/18* | (2006.01) |
| *F16B 21/02* | (2006.01) |
| *H05K 5/02* | (2006.01) |
| *B64D 47/00* | (2006.01) |
| *H05K 7/14* | (2006.01) |

(52) U.S. Cl.
CPC .............. *F16B 21/09* (2013.01); *B64D 47/00* (2013.01); *F16B 21/02* (2013.01); *H05K 5/0221* (2013.01); *G06F 1/187* (2013.01); *G06F 1/188* (2013.01); *H05K 7/1409* (2013.01); *H05K 7/1411* (2013.01)

(58) Field of Classification Search
CPC ....... F16B 21/09; F16B 21/02; H05K 5/0221; B64D 47/00; G06F 1/188; G06F 1/184
See application file for complete search history.

(56) References Cited

U.S. PATENT DOCUMENTS

| | | | |
|---|---|---|---|
| 3,575,482 A | 4/1971 | MacMaster et al. | |
| 4,931,907 A | 6/1990 | Robinson et al. | |
| 5,009,385 A | 4/1991 | Burgener et al. | |
| 5,010,426 A * | 4/1991 | Krenz | G11B 25/043 360/137 |
| 5,564,668 A | 10/1996 | Crowe, III | |
| 5,761,045 A * | 6/1998 | Olson | G06F 1/189 312/223.2 |
| 6,147,872 A * | 11/2000 | Roy | H05K 7/1409 211/41.17 |
| 6,222,736 B1 * | 4/2001 | Sim | G06F 1/184 361/727 |
| 6,272,005 B1 * | 8/2001 | Jensen | G06F 1/184 312/223.1 |
| 6,373,713 B1 * | 4/2002 | Jensen | H05K 7/1409 211/41.17 |
| 6,927,983 B1 | 8/2005 | Beseth et al. | |
| 7,032,862 B2 | 4/2006 | Landes et al. | |
| 7,417,866 B1 | 8/2008 | Beseth et al. | |
| 7,515,428 B2 * | 4/2009 | Tang | G06F 1/188 361/727 |
| 8,611,103 B2 * | 12/2013 | Thomas | H05K 7/1489 361/679.58 |

(Continued)

*Primary Examiner* — Dimary Lopez Cruz
*Assistant Examiner* — Abhishek Rathod
(74) *Attorney, Agent, or Firm* — Cantor Colburn LLP

(57) ABSTRACT

A retainer assembly is adapted to secure a removable electronic unit within an avionics equipment mounting tray. The retainer assembly includes a latch having a base portion and a handle portion. The base portion is pivotally coupled to one of the removable electronic unit and the avionics equipment mounting tray. The handle portion projects outward from the base portion. The base portion includes a cam surface adapted to releasably contact the other of the removable electronic unit and the avionics equipment mounting tray.

16 Claims, 2 Drawing Sheets

(56) References Cited

U.S. PATENT DOCUMENTS

| | | | |
|---|---|---|---|
| 9,753,504 B2 * | 9/2017 | Norton | H05K 7/1487 |
| 9,804,642 B2 * | 10/2017 | Chen | G06F 1/187 |
| 9,943,004 B2 * | 4/2018 | Canfield | H05K 7/1417 |
| 2003/0080568 A1 * | 5/2003 | Busby | A47B 81/06 |
| | | | 292/197 |
| 2011/0233372 A1 | 9/2011 | Rodrig | |

* cited by examiner

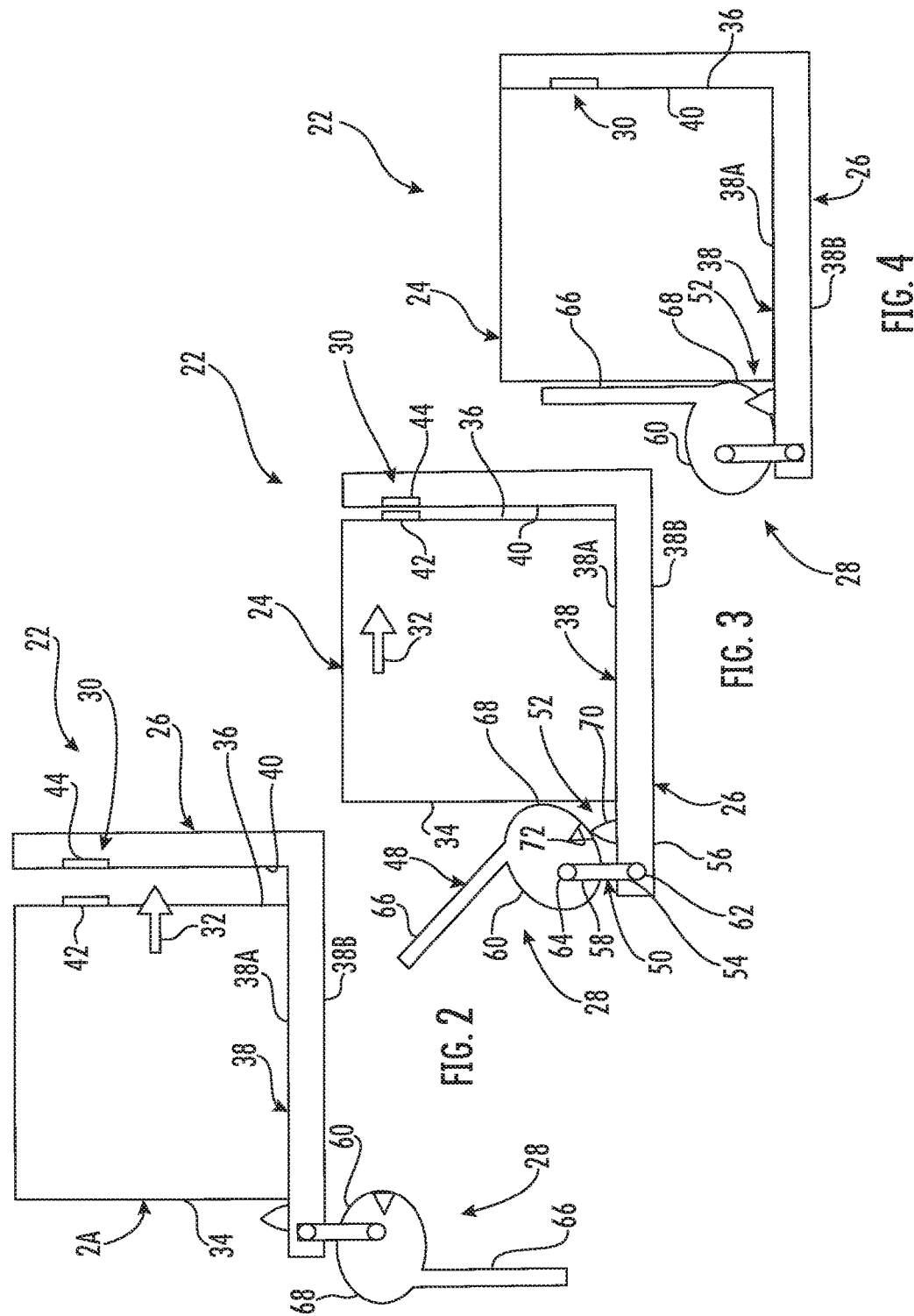

AVIONICS CAM RETAINER ASSEMBLY

BACKGROUND

The present disclosure relates to a cam retainer assembly, and more particularly, to a cam retainer assembly for securing a removable electronic unit within an avionics equipment mounting tray.

Aircraft often include avionics equipment assemblies having removable electronic units and/or controllers that detachably slide into electronic equipment mounting trays, or racks, of the avionics equipment assemblies. In a typical application, the trays may assist in aligning electrical connectors supported by and between the tray and the electronic unit. The electronic units may be retained in the tray by, for example, swing bolts capable of exerting high clamping forces between the electronic unit and the tray. Unfortunately, known swing bolts and other retaining devices may be expensive, large or awkward for purposes of packaging, and heavy.

BRIEF DESCRIPTION

A retainer assembly according to a, non-limiting, embodiment of the present disclosure secures a removable electronic unit in an avionics equipment mounting tray of an aircraft. The retainer assembly includes a latch including a base portion pivotally coupled to one of the removable electronic unit and the avionics equipment mounting tray, and a handle portion projecting outward from the base portion, wherein the base portion includes a cam surface adapted to releasably contact the other of the removable electronic unit and the avionics equipment mounting tray.

Additionally to the foregoing embodiment, the retainer assembly includes a swing arm including a first end segment pivotally connected to one of the removable electronic unit and the avionics equipment mounting tray at a first pivot axis, and an opposite second end portion pivotally connected to the base portion at a second pivot axis.

In the alternative or additionally thereto, in the foregoing embodiment, the first end segment is pivotally connected to the avionics equipment mounting tray.

In the alternative or additionally thereto, in the foregoing embodiment, the retainer assembly includes a catch device carried between the latch and the avionics equipment mounting tray.

In the alternative or additionally thereto, in the foregoing embodiment, the latch is adapted to swing about the first pivot axis via the swing arm and between a swung clear position and a catch position, wherein the catch device is engaged when in the catch position.

In the alternative or additionally thereto, in the foregoing embodiment, the latch is adapted to pivot about the second pivot axis and between a released state and a retained state when in the catch position.

In the alternative or additionally thereto, in the foregoing embodiment, the cam surface is not in contact with the removable electronic unit when in the released state, and the cam surface is in contact with the removable electronic unit when in the retained state.

In the alternative or additionally thereto, in the foregoing embodiment, the cam surface is in biased contact with the removable electronic unit when in the retained state.

In the alternative or additionally thereto, in the foregoing embodiment, the first and second pivot axes are substantially parallel to one-another.

An avionics equipment assembly according to another, non-limiting, embodiment includes a removable electronic unit; an avionics equipment mounting tray; and a cam latch for securing the removable electronic unit in the avionics equipment mounting tray.

Additionally to the foregoing embodiment, the cam latch includes a base portion pivotally coupled to the avionics equipment mounting tray, and a handle portion projecting outward from the base portion, wherein the base portion includes a cam surface adapted to releasably contact the removable electronic unit.

In the alternative or additionally thereto, in the foregoing embodiment, the avionics equipment assembly includes an electrical connector device carried between a forward facing face of the avionics equipment mounting tray and a rearward facing surface of the removable electronic unit, wherein the removable electronic unit is adapted to be inserted into the avionics equipment mounting tray in a rearward direction.

In the alternative or additionally thereto, in the foregoing embodiment, the cam surface is in contact with a forward facing surface of the removable electronic unit when in a retained state.

In the alternative or additionally thereto, in the foregoing embodiment, the avionics equipment assembly includes a swing arm including a first end segment pivotally connected to the avionics equipment mounting tray at a first pivot axis, and an opposite second end portion pivotally connected to the base portion at a second pivot axis.

In the alternative or additionally thereto, in the foregoing embodiment, the first end segment is pivotally connected to a bottom wall of the avionics equipment mounting tray.

In the alternative or additionally thereto, in the foregoing embodiment, the avionics equipment assembly includes a catch device carried between the base portion and the bottom wall.

In the alternative or additionally thereto, in the foregoing embodiment, the base portion is adapted to swing about the first pivot axis via the swing arm and between a swung clear position wherein the latch is disposed below the bottom wall, and a catch position wherein the catch device is engaged and the base portion is disposed above the bottom wall.

In the alternative or additionally thereto, in the foregoing embodiment, the base portion is adapted to pivot about the second pivot axis and between a released state and the retained state when in the catch position.

In the alternative or additionally thereto, in the foregoing embodiment, the cam surface is spaced from the forward facing surface when in the released state.

In the alternative or additionally thereto, in the foregoing embodiment, the first and second pivot axes are substantially parallel to one-another.

The foregoing features and elements may be combined in various combinations without exclusivity, unless expressly indicated otherwise. These features and elements as well as the operation thereof will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows:

FIG. 2 is a schematic of the avionics equipment assembly including a retainer assembly illustrated in a swung clear position;

FIG. 3 is a schematic of the avionics equipment assembly with the retainer assembly approaching a catch position; and FIG. 4 is a schematic of the avionics equipment assembly with the retainer assembly in the catch position, and a latch of the retainer assembly in a retained state.

DETAILED DESCRIPTION

Figure 1:
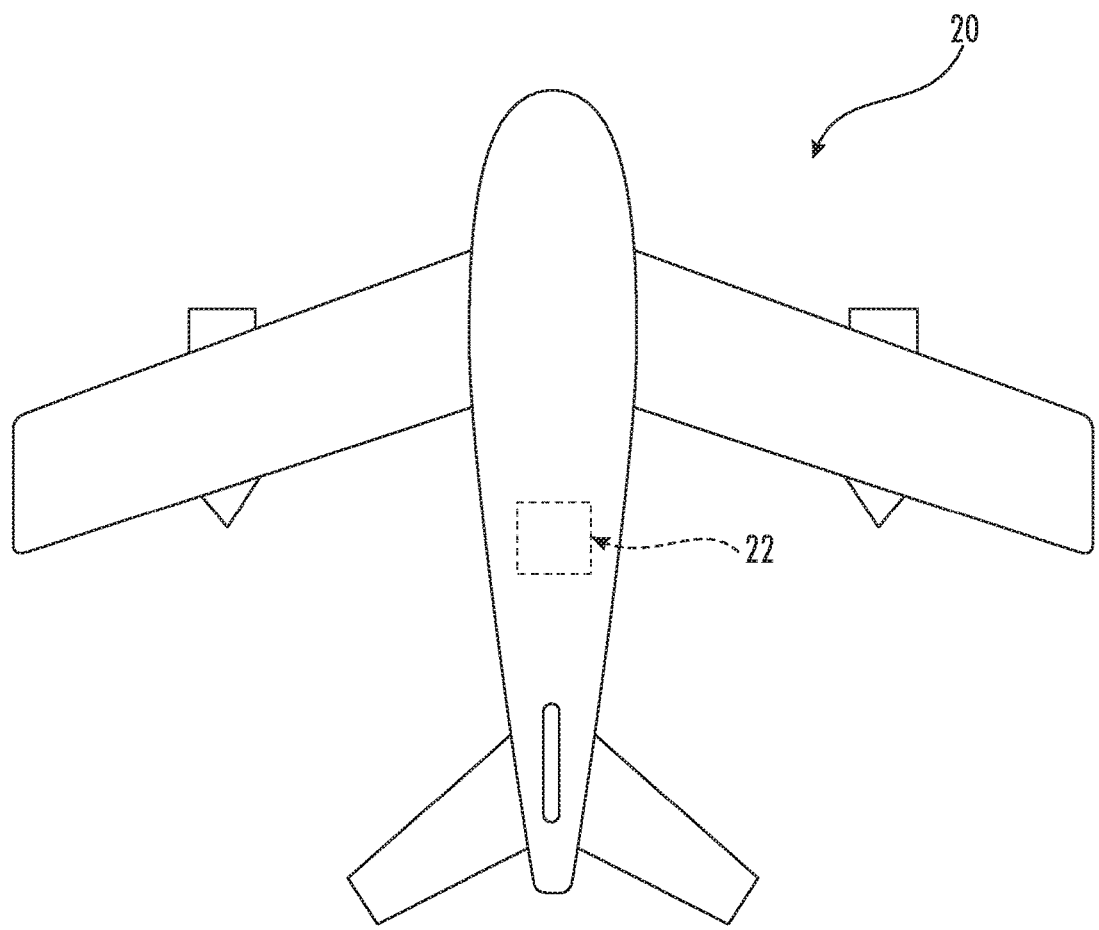
FIG. 1 is a schematic of an aircraft utilizing an avionics equipment assembly as one exemplary embodiment.

Referring to FIG. 1, an aircraft 20 includes an avionics equipment assembly 22. As best shown in FIG. 2, the avionics equipment assembly 22 may include an electronic unit 24, an equipment mounting tray 26, a retainer assembly 28, and at least one electrical connector device 30. The equipment mounting tray 26 may be part of a rack, and/or may be located in an avionics bay (not shown). The removable electronic unit 24 may be generally portable, and/or a plug-in electronic unit operatively connectable to a supply of power and/or a central control system of the aircraft 20 via the equipment mounting tray 26. In operation, the electronic unit 24 is adapted to slide into, and out of, the equipment mounting tray 26. Examples of an electronic unit 24 may be any electronic device including a controller, and the traditionally known black-box recorder.

When electronic unit 24 is being inserted into the equipment mounting tray 26, the electronic unit 24 moves along an insertion, or rearward, direction (see arrow 32) that may be substantially horizontal. During this insertion, the electrical connector device 30, which is carried between the electronic unit 24 and the equipment mounting tray 26, becomes mated. That is, the mating direction of the electrical connector device 30 may be substantially the same as the rearward direction 32.

The electronic unit 24 may include opposite facing, forward and rearward facing, surfaces, or walls, 34, 36. The surfaces 34, 36 may be substantially normal to the insertion direction 32. The equipment mounting tray 26 may include a wall 38 having opposite sides 38A, 38B and a face, or wall, 40. In one embodiment, the face 40 may project outward from, and/or may be substantially normal to, the side 38A of the wall 38. The wall 38 may be a bottom wall and may be substantially parallel to the rearward direction 32. The face 40 may face forward with respect to the rearward direction 32.

When the avionics equipment assembly 22 is assembled (see FIG. 4), the side 38A of the bottom wall 38 may face, may be located below, and may be in sliding contact with, the electronic unit 24. In another embodiment (not illustrated), the wall 38 may be a top wall, and the side 38A may face, and may be located above, the electronic unit 24. Also when assembled, the rearward facing surface 36 of the electronic unit 24 may be in close proximity to, and may substantially opposed to, the forward facing face 40.

The electrical connector device 30 may be supported by, and generally carried between, the forward facing face 40 of the equipment mounting tray 26 and the rearward facing surface 36 of the electronic unit 24. More specifically, the electrical connector device 30 may include a first connector 42 (i.e., male or female) secured to the rearward surface 36, and a second connector 44 secured to the forward face 40 and adapted to electrically mate with the first connector 42.

Referring to FIG. 3, the retainer assembly 28 may generally be a cam retainer assembly, and is adapted to secure the electronic unit 24 in the equipment mounting tray 26. The retainer assembly 28 may include a latch 48, a swing arm 50, and a catch device 52. The swing arm 50 may include a first end segment 54 pivotally engaged to a forward projecting lip 56 of the bottom wall 38, and an opposite second end segment 58 pivotally engaged to a base portion 60 of the latch 48. The first end segment 54 of the swing arm 50 may pivot with respect to the lip 56 of the tray 26, and about pivot axis 62. The second end segment 58 may pivot with respect to the base portion 60, and about pivot axis 64. In one embodiment, the pivot axes 62, 64 may be substantially parallel to one-another, and substantially normal to the rearward direction 32.

The latch 48 of the retainer assembly 28 may be a cam latch, and may include the base portion 60 and a handle portion 66 that may project radially outward from the base portion 60 with respect to pivot axis 64. The base portion 60 may include and carries an arcuate cam surface 68 that extends circumferentially with respect to pivot axis 64.

In operation, the retainer assembly 28 of the avionics equipment assembly 22 is adapted to pivot about axis 62, and move between a swung clear position (see FIG. 2), and a catch position (see FIGS. 3 and 4). When in the catch position, the base portion 60 of the latch 48 is adapted to pivot about axis 64, and move between a released state (see FIG. 3) and a retained state (see FIG. 4). When in the swung clear position, the retainer assembly 28 is in opposition to the side 38B of the wall 38. In one embodiment where the wall 38 is a bottom wall, the retainer assembly 28 is located below the projecting lip 56 of the bottom wall 38. With the retainer assembly 28 in the swung clear position, the retainer assembly does not obstruct removal of the electronic unit 24 from the equipment mounting tray 26.

As the retainer assembly 28 moves from the swung clear position and toward the catch position, the swing arm 50 pivots about axis 62, and the latch 48 swings about a distal edge of the lip 56 of the wall 38 generally placing the latch 48 in opposition to the forward facing surface 34 of the electronic unit 24. Prior to entering the catch position, the cam surface 68 of the latch base portion 60 opposes, and may be spaced from, the forward facing surface 34 of the electronic unit 24.

When the retainer assembly 28 is in the catch position, the catch device 52 is generally engaged. More specifically, a tab 70 of the catch device 52 that may be attached to the lip 56 of the wall 38 and projects outward from wall side 38A, may be in contact with a stop 72 carried by the base portion 60 of the latch 48. In one embodiment, the stop 72 may face in a circumferential direction with respect to axis 64, and away from the forward facing surface 34 of the electronic unit 24 when he retainer assembly 28 is in the catch position. It is contemplated and understood that the tab 70 and the stop 72 of the catch device 52 may generally be reversed.

Also when the retainer assembly 28 is in the catch position, and while the latch 48 is in the released state, the cam surface 68 of the base portion 60 may be spaced from, and in opposition to, the forward facing surface 34 of the electronic unit 24. When the base portion 60 is pivoted about axis 64 and moves toward the retained state (see FIG. 4), the cam surface 68 makes contact with the forward facing surface 34 of the electronic unit 24, and may exert a force that moves and biases the electronic unit 24 in the rearward direction 32. A reactive force is exerted between the tab 70 and the stop 72 of the catch device 52. When the latch 48 is in the retained state, the electronic unit 24 is fully secured, and located within, the equipment mounting tray 26 via a clamping force exerted upon the electronic unit 24 by the retainer assembly 28.

Advantages and benefits of the present disclosure include a retainer assembly 28 that is generally an integrated part of the equipment mounting tray 26 (i.e., not separate pieces from the tray when in the clear position), and capable of high preload clamping (e.g., greater than 600 pounds) of the electronic unit 24 into the tray 26. Other advantages include the ability to establish the preload clamping force by providing the appropriate size and shape of the cam surface 68 (i.e., lobe size). Once the preload is met, the cam latch 48 may snap into the retained state, by a spring loaded hook and release mechanism (not shown).

Other advantages may include easy installation and removal of electronic units, reduced retainer assembly costs when compared to more traditional retainers, simple and reliable positive retention, and no installation or removal tools required.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A retainer assembly for securing a removable electronic unit in an avionics equipment mounting tray of an aircraft, the retainer assembly comprising:
   a latch including a base portion pivotally coupled to one of the removable electronic unit and the avionics equipment mounting tray, and a handle portion projecting outward from the base portion, wherein the base portion includes a cam surface adapted to releasably contact the other of the removable electronic unit and the avionics equipment mounting tray; and
   a swing arm including a first end segment pivotally connected to the avionics equipment mounting tray at a first pivot axis, and an opposite second end portion pivotally connected to the base portion at a second pivot axis.

2. The retainer assembly set forth in claim 1, further comprising:
   a catch device carried between the latch and the avionics equipment mounting tray.

3. The retainer assembly set forth in claim 2, wherein the latch is adapted to swing about the first pivot axis via the swing arm and between a swung clear position and a catch position, wherein the catch device is engaged when in the catch position.

4. The retainer assembly set forth in claim 3, wherein the latch is adapted to pivot about the second pivot axis and between a released state and a retained state when in the catch position.

5. The retainer assembly set forth in claim 4, wherein the cam surface is not in contact with the removable electronic unit when in the released state, and the cam surface is in contact with the removable electronic unit when in the retained state.

6. The retainer assembly set forth in claim 5, wherein the cam surface is in biased contact with the removable electronic unit when in the retained state.

7. The retainer assembly set forth in claim 1, wherein the first and second pivot axes are substantially parallel to one-another.

8. An avionics equipment assembly comprising:
   a removable electronic unit;
   an avionics equipment mounting tray;
   a cam latch for securing the removable electronic unit in the avionics equipment mounting tray, the cam latch including a base portion pivotally coupled to the avionics equipment mounting tray, and a handle portion projecting outward from the base portion, wherein the base portion includes a cam surface adapted to releasably contact the removable electronic unit; and
   a swing arm including a first end segment pivotally connected to the avionics equipment mounting tray at a first pivot axis, and an opposite second end portion pivotally connected to the base portion at a second pivot axis.

9. The avionics equipment assembly set forth in claim 8, further comprising:
   an electrical connector device carried between a forward facing face of the avionics equipment mounting tray and a rearward facing surface of the removable electronic unit, wherein the removable electronic unit is adapted to be inserted into the avionics equipment mounting tray in a rearward direction.

10. The avionics equipment assembly set forth in claim 9, wherein the cam surface is in contact with a forward facing surface of the removable electronic unit when in a retained state.

11. The avionics equipment assembly set forth in claim 10, wherein the first end segment is pivotally connected to a bottom wall of the avionics equipment mounting tray.

12. The avionics equipment assembly set forth in claim 11, further comprising:
   a catch device carried between the base portion and the bottom wall.

13. The avionics equipment assembly set forth in claim 12, wherein the base portion is adapted to swing about the first pivot axis via the swing arm and between a swung clear position wherein the latch is disposed below the bottom wall, and a catch position wherein the catch device is engaged and the base portion is disposed above the bottom wall.

14. The avionics equipment assembly set forth in claim 13, wherein the base portion is adapted to pivot about the second pivot axis and between a released state and the retained state when in the catch position.

15. The avionics equipment assembly set forth in claim 14, wherein the cam surface is spaced from the forward facing surface when in the released state.

16. The avionics equipment assembly set forth in claim 10, wherein the first and second pivot axes are substantially parallel to one-another.

* * * * *